US012716923B2

(12) United States Patent
Elrod et al.

(10) Patent No.: US 12,716,923 B2
(45) Date of Patent: Aug. 25, 2026

(54) MULTI-CHANNEL HANDHELD DIGITAL MULTIMETER HAVING SEPARATE COMMON TERMINALS

(71) Applicant: Fluke Corporation, Everett, WA (US)

(72) Inventors: Jeffrey Elrod, Seattle, WA (US); Michael Perry, Mulkiteo, WA (US); Joseph Ferrante, Redmond, WA (US); George Allen, Seattle, WA (US); Jeffrey C. Hudson, Snohomish, WA (US); John Gilbert, Seattle, WA (US)

(73) Assignee: Fluke Corporation, Everett, WA (US)

( * ) Notice: Subject to any disclaimer, the term of this patent is extended or adjusted under 35 U.S.C. 154(b) by 230 days.

(21) Appl. No.: 18/612,310

(22) Filed: Mar. 21, 2024

(65) Prior Publication Data

US 2024/0319237 A1 Sep. 26, 2024

Related U.S. Application Data

(60) Provisional application No. 63/491,926, filed on Mar. 23, 2023.

(51) Int. Cl.
*G01R 19/25* (2006.01)

(52) U.S. Cl.
CPC .................................... *G01R 19/25* (2013.01)

(58) Field of Classification Search
CPC ............. G01R 21/133; G01R 19/2513; G01R 22/063; G01R 22/10; G01R 19/165; G01R 35/04; G01R 22/00; G01R 21/06; G01R 19/00; G01R 15/125; G01R 19/2509; G01R 11/25; G01R 22/061; G01R 31/54; G01R 1/30; G01R 31/007; G01R 1/04; G01R 19/25; G01R 31/50; G01R 13/00; G01R 11/57; G01R 27/025; G01R 27/08; G01R 27/14; G06K 19/07707; G06K 7/006; G06F 2221/2135; G06F 2221/2151; G06F 18/20; G06F 17/00; G06F 17/40
See application file for complete search history.

(56) References Cited

U.S. PATENT DOCUMENTS 4,786,982 A * 11/1988 Wakahara .......... G11B 15/1875 360/71
5,166,599 A * 11/1992 Hochreuther .......... G01R 15/12 324/157

(Continued)

FOREIGN PATENT DOCUMENTS

CN 101706523 B 8/2011
JP H08256027 A 10/1996

OTHER PUBLICATIONS

Metrix®, "SCOPIX IV Oscilloscopes with Isolated Channels New Generation," Chauvin Arnoux Group, 2018, 8 pages.

*Primary Examiner* — Vinh P Nguyen
(74) *Attorney, Agent, or Firm* — Seed Intellectual Property Law Group LLP

(57) ABSTRACT

A single handheld multimeter device includes two or more independent measurement channels that are completely electrically separated and independent from one another. Each measurement channel has its point of reference, typically configured to be coupled to the ground. Measurements by the two or more independent measurement channels can be conducted concurrently, and the measurement results of the two channels can be processed and displayed together.

24 Claims, 5 Drawing Sheets

(56) References Cited

U.S. PATENT DOCUMENTS

| | | | | |
|---|---|---|---|---|
| 6,271,654 | B1 * | 8/2001 | Chen | G01R 15/125 324/142 |
| 7,034,517 | B2 | 4/2006 | Newcombe | |
| 7,535,233 | B2 * | 5/2009 | Kojovic | G01R 31/088 324/509 |
| 7,679,356 | B2 | 3/2010 | Garland et al. | |
| 8,358,121 | B2 | 1/2013 | Hudson et al. | |
| 9,739,801 | B2 * | 8/2017 | Anderson | G01R 15/125 |

* cited by examiner

MULTI-CHANNEL HANDHELD DIGITAL MULTIMETER HAVING SEPARATE COMMON TERMINALS

BACKGROUND

Technical Field

The present disclosure relates generally to digital multimeters. More particularly, the disclosure relates to a digital multimeter having two or more channels for conducting two or more measurements.

Description of the Related Art

Digital multimeters (DMMs) function to measure several electrical parameters as needed for service, troubleshooting, and maintenance. Such parameters may include AC voltage and current, DC voltage and current, resistance and continuity. Sometimes, a DMM may measure other parameters, such as capacitance and temperature. A DMM will often be configured as a handheld unit having a rotary knob by which various functions are selected. A few lead jacks may be provided in the case (i.e., housing) of the unit for the connection of test leads. The specific jack or jacks used may depend on the function that has been selected. A display, e.g., an LCD display, provides a reading of the measured parameter.

The plurality of lead jacks or input terminals includes a common input terminal and one or more test input terminals. The test input terminals may include a volt/ohms input terminal and one or more amps or microamps input terminals. The common input terminal is coupled to the ground, and a lead of a test probe is inserted into one of the test input terminals for the respective measurement tasks. For example, to measure microamps, a DMM user must disconnect the test probe from the volt/ohms terminal and connect it to the microamps terminal. Some DMMs may include a single test input terminal. That is, a current measurement and a voltage measurement can be conducted using the same test input terminal, under separate measurement modes selected by a user through a user interface of the DMMs. Further, some DMMs may include test terminals different from test probes and input lead jacks. For example, DMMs may include a contact-free test end, e.g., a U-shaped recess portion, having measurement sensors embedded therein. The measurement sensors function to measure the electrical parameters of an object received in the U-shaped recess portion without galvanically contacting the object.

BRIEF SUMMARY

A single handheld DMM device includes two or more measurement channels. A first measurement channel of two or more measurement channels is configured to measure an electrical parameter of an object and determine a first measurement value. The first measurement channel includes a first common terminal (point of reference). A second measurement channel of the two or more measurement channels is configured to measure an electrical parameter of an object and determine a second measurement value. The second measurement channel includes a second common terminal (point of reference) that is separate from the first common terminal. The second measurement channel is electrically isolated from the first measurement channel.

The handheld DMM device also includes a processing unit electrically coupled to both the first measurement channel and the second measurement channel. The processing unit is configured to receive the first measurement value and the second measurement value. The handheld DMM device also includes a display electrically coupled to the processing unit and configured to present one or more of the first measurement value and or the second measurement value, or a combination thereof, on the same display.

These concepts and features, as well as other concepts and features, are exemplified by various embodiments of the handheld DMM devices described herein.

DETAILED DESCRIPTION

Figure 1:
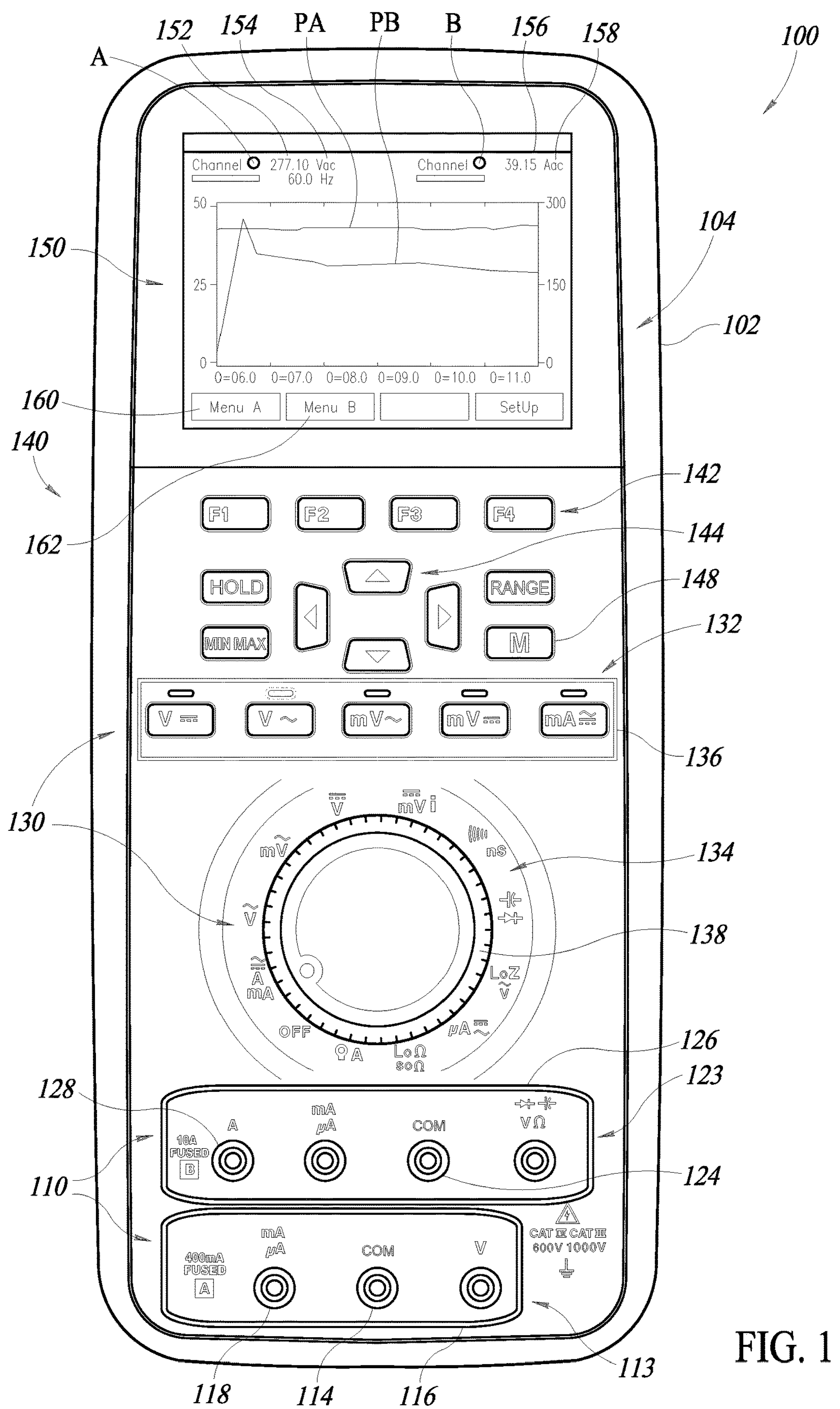
FIG. 1 shows a front view of a user interface of a digital multimeter device according to at least one embodiment of the present disclosure.

It is recognized in the present disclosure that existing DMM solutions cannot accurately conduct concurrent measurements of two signals.

In the present disclosure, a single handheld DMM device includes two or more independent measurement channels that are completely electrically separated and independent from one another, each having its own point of reference, e.g., ground terminal. Measurements by the two (or more) independent channels can be independently controlled and/or simultaneously conducted, and the measurement results of the two channels can be processed and displayed together. For example, the DMM has a single display device capable of presenting the measurement results of the two channels together in various manners. For example, the measurement results could be presented in the single display separately and concurrently in respective regions or together in a graphing manner, and a calculation result obtained based on the measurement results of the two channels can be presented in the single display in substantially real-time, separately or together with the measurement results.

The two or more measurement channels each have their dedicated user control interface sections, e.g., to achieve independent control. In some implementations, their user control mechanisms are different, one with electro-mechanical relay buttons and the other with a mechanical rotary. This will enable users to easily identify the respective channels used for the respective measurements.

Because the two measurement channels are electrically isolated from one another and each has its own point of reference, measurements by the two measurement channels can be simultaneously conducted, and the measurement results of the two channels can be processed and displayed together.

As the measurement operations of the two channels can be conducted by the same DMM device, the measurement results of the two channels can be easily synchronized using, e.g., a common time stamping mechanism of the DMM device. Even if the measurements of the two channels are not done exactly concurrently, interpolating the measurement data of the two channels will be easier because the time stamps of the two measurements are handled by the same processor in the DMM device.

As the measurements of the two channels are conducted by the same DMM device, local (without being connected to another measurement device or a remote server) processing of the measurement results of the two channels is possible, which conveniently provides the user with the processing results in substantially real-time. Such offline processing capacity of measurements of different electrical parameters is critical in that many measurement sites may not have network access. For example, current measurement and resistance measurement can be processed together to evaluate how the resistance value of a circuit element is related to the current passing through another element of the circuit, e.g., due to the heat brought about by the current.

Turning now to FIG. 1, in accordance with some embodiments of the present disclosure, an example DMM device 100 is provided.

In the illustrated embodiment, the DMM device 100 includes a body or box frame 102 and a user interface (or I/O interface) 104 on one or more surfaces of the box frame 102. The user interface 104 includes a measurement section 110, a mode selection section 130, a keypad section 140, and a display section or display 150.

The measurement section 110 includes measurement interfaces for connecting measurement equipment, e.g., probes. As an illustrative example, FIG. 1 shows measurement section 110 having two measurement sets 113, 123 of measurement terminals or lead jacks. The two measurement sets 113, 123 of terminals or lead jacks correspond to a first measurement channel 112 (FIG. 2) and a second measurement channel 122 (FIG. 2), respectively, that are completely electrically isolated from one another. It is noted that the measurement channels 112, 122 each include more than the measurement sets 113, 123 shown on the user interface 104, and also include circuits within the box frame 102 that are coupled to the measurement sets 113, 123.

In some implementations, as illustratively shown in FIG. 1, the two measurement sets 113, 123 are identified using color marks to differentiate from one another. For example, the first measurement set 113 is marked with blue color mark 116, and the second measurement set 123 is marked with yellow color mark 126, which is different and easily distinguishable from the blue color of the first measurement set 113.

In the illustrated embodiment, the first measurement channel 112 includes a first common (COM) terminal 114, which is configured to be a return terminal (or point of reference) for all measurement modes of the first measurement channel. The second measurement channel 122 includes a second (COM) terminal 124, which is configured to be a return terminal (or point of reference) for all measurement modes of the second measurement channel. The first COM terminal 114 and the second COM terminal 124 are physically separated from one another and electrically isolated from one another and are each electrically isolated from the earth ground.

Each of the first and second measurement channels 112, 122 also include one or more input terminals 118, 128, respectively. For example, as illustratively shown in FIG. 1, the first measurement channel 112 includes an input terminal for voltage measurement modes (AC/DC) and an input terminal for milliamps and microamps (AC/DC) level current measurement modes. The second measurement channel 122 includes an input terminal for amps (AC/DC) level current measurement, an input terminal for milliamps and microamps (AC/DC) level current measurement, and an input terminal for other measurement modes, including those for measuring voltage, resistance, diode test, capacitance, and temperature.

The mode selection section 130 includes a first mode selection unit 132 for the first measurement channel 112 and a second mode selection unit 134 for the second measurement channel 122. In some implementations, as illustratively shown in FIG. 1, the first mode selection unit 132 and the second mode selection unit 134 are different from one another in appearance and in the operation mechanisms such that a user will not be confused between the two mode selection units 132, 134.

In some implementations, the first mode selection unit 132 is identified using a first color identifier 136, illustratively a blue color, which is the same color as the color mark 116 of the first measurement channel 112. The second mode selection unit 134 is identified using a second color identifier 138, illustratively a yellow color, which is the same color as the yellow color mark 126 of the second measurement channel 122.

In some implementations, the first mode selection unit 132 includes a set of control relays, e.g., electro-mechanical relay buttons, each configured to activate a measurement mode of the first measurement channel 112. The physical signal path of the measurement circuit corresponding to the measurement modes is switched by a set of electro-mechanical relays, under firmware control as directed by the inputs through the relay buttons of the first mode selection unit 132. The relay buttons may also activate a menu (described later herein) shown on the display section 150 to enable further user selection of measurement modes and/or specific parameters on a selected measurement mode. FIG. 1 illustratively shows that the first mode selection unit 132 includes relay buttons for measurement modes of AC voltage, DC voltage, AC millivolts, DC millivolts, and AC/DC milliamps, which do not limit the scope of the disclosure. The first mode selection unit 132 may include relay buttons or menus under a relay button control to select or activate other measurement modes to measure other parameters, like capacitance, resistance, continuity, or other physical parameters like temperature, which are all included in the scope of the disclosure.

In some implementations, the second mode selection unit 134 is a control rotary, e.g., a rotary switch that includes, as illustratively shown in FIG. 1, positions for selecting measurement modes of DC voltage, DC millivolts, AC voltage, AC millivolts, capacitance, diode test, AC voltage/LoZ (which prevents reading due to ghost voltage), AC/DC amps and milliamps, AC/DC microamps, temperature, resistance, and continuity, which still do not limit the scope of the disclosure. The second mode selection unit 134 or the control rotary may include more or fewer mode selections than the illustrative examples shown in FIG. 1.

In some implementations, the first mode selection unit 132 and the second mode selection unit 134 are configured to include the same sets of mode selections with exactly the same parameters for the corresponding measurement modes in the sets of mode selections. For example, the AC millivolts modes in the first mode selection unit 132 and the second mode selection unit 134 have the same ranges of voltage values that can be measured under the modes.

In some implementations, the first mode selection unit 132 and the second mode selection unit 134 include different sets of mode selections between one another. As illustrated in FIG. 1, the second mode selection unit 134 includes more measurement modes than the first mode selection unit 132. Further, for similar measurement modes in the two-mode selection units, the parameters may be configured to be different. For example, in a case where each of the two mode selection units 132, 134 includes a voltage with low pass filter measurement mode, the parameters of the low pass filters may be configured to be different.

In some implementations, the different sets of measurement modes between the two mode selection units 132, 134 reflect that the corresponding measurement circuits of the two measurement channels 112, 122 are different. The designs of each measurement circuit can be optimized or adapted to meet the requirements of the respective measurement modes. For example, as the example shown in FIG. 1, the circuit of the first measurement channel 112 may not include a low pass filter for the voltage measurement circuitry, and may not include relevant circuitry for resistance measurement, e.g., the circuitry for injecting a small current into the object to be measured. As illustratively shown in FIG. 1, the circuit of the first measurement channel 112 is fused at 400 mA, while the circuit of the second measurement channel 122 is fused at 10 Amps, which indicates that the two measurement channels 112, 122 include different circuitry configurations.

In some implementations, one or more of the first mode selection unit 132 and the second mode selection unit 134 include an ON/OFF switch. For example, as shown in FIG. 1, the rotary switch of the second mode selection unit 134 includes an "OFF" position configured to stop taking measurements and turn the second measurement channel off. For the first mode selection unit 132, when none of the mode selection buttons is selected, the first measurement channel is turned off.

As shown in FIG. 1, the two measurement channels 112, 122 are independently controlled using different control mechanisms. FIG. 1 shows that the first control mechanism, a rotary switch, is used to control the measurement mode selection and the related signal path for the second measurement channel 122, and a second control mechanism, push buttons and menus, is used to control the measurement mode selection and the related signal path for the first measurement channel 112.

In some implementations, it is possible to use a rotary switch or a push button/relay to control for both measurement channels, which is included in the scope of the disclosure, and which can be advantageous in some implementation scenarios based on size, cost, and production management of the DMM devices.

In some implementations, the user interface 104 includes a master switch 148 configured to enable users to use one rotary switch to control the measurement selection and signal path of both measurement channels.

In some implementations, the measurement mode selection of one or more of first measurement channel 112 or the second measurement channel 122 may be conducted remotely by a remote controller that is communicatively coupled to the device 100.

The two measurement channels 112, 122 are controllable and operate entirely independently of each other. Either one of the measurement channels or both measurement channels can be active in various measurement scenarios.

In some implementations, the similar measurement modes of the two measurement channels 112, 122 are designed to measure the same electrical parameter with different measurement granular levels. For example, as shown in FIG. 1, the first measurement channel 112 includes a current measurement mode that is configured to measure current in milliamps and microamps levels, and the second measurement channel 122 is configured to measure current up to the ampere levels. The varied granular level designs between the two measurement channels enable the optimization of each corresponding measurement circuits for the targeted measurement scenarios.

The keypad section 140 includes various buttons for various different functions, including standard digital multimeter buttons, such as "HOLD," "MINMAX," "RANGE," "Function," "Log" other buttons for audible signal, relative mode, cursor buttons, information, etc. FIG. 1 illustratively shows some of the standard buttons, which does not limit the scope of the disclosure. The keypad section 140 also includes one or more menu buttons 142, illustratively shown as four buttons "F1," "F2," "F3," and "F4," configured to activate functions related to, among others, the data processing and presentation of the measurement results from the two measurement channels 112 and 122. The functions include calculation function, plotting/graphing function, data fusing function, data interpolating function, and other functions that process or present measurement results of the two measurement channels 112 and 122. The cursor buttons 144 are configured to be used to, among others, make additional selections for those functions, together with the menu buttons 142.

The display section 150 may include a display panel of a plurality of pixels, e.g., a LED or LCD display panel, and a display module including various circuitry that enable the pixels of the display panel to display information. The display section is configured to display measurement results from both the first measurement channel A and the second measurement channel B. As an illustrative example, as shown in FIG. 1, the first measurement channel A measures an AC voltage and the second channel B measures an AC current. For both the first channel A and the second channel B, multiple measurement values are obtained in a time sequence and presented together in line graphs PA, PB, respectively, along a same time axis.

The display section 150 shows a first measurement value 152 and a first measurement type or mode indication 154 (illustratively reading, respectively, "277.10" and "$V_{ac}$"), corresponds to a measurement by the first measurement channel A. The measurement type or mode of the first measurement channel A is selected on the first mode selection unit 132, e.g., a relay set, illustratively showing AC voltage mode button "V~" is selected. In addition, the display section 150 includes a second measurement value 156 and a second measurement type indication 158 that corresponds to a measurement from the second measurement channel B (illustratively reading, respectively, "39.15" and "$A_{ac}$"). The measurement type or mode of the second measurement channel B is selected on the second mode selection unit 134, e.g., a rotary switch, illustratively shown as being pointed to AC/DC current mode "A/mA~".

The first measurement value 152 of the first channel A and the second measurement value 156 of the second measurement channel B can each be a current measurement value, an average measurement value, a maximum measurement value, a minimum measurement value, a range value, or other types of values, upon user selection through the menu buttons 142 and cursor buttons 144.

The display section 150 also includes a capacitive touch screen and includes touchscreen buttons 160, 162 for the menu selections of various functions, parameters, or display setups for the first measurement channel A and the second measurement channel B, respectively. The menus can be activated through the touchscreen button together with or separately from the mode selection of each measurement channel. Other touchscreen buttons, like a 'SetUp' button, are also possible, and included in the scope of the disclosure.

With the graphing function of a processing unit (described later herein), as illustratively shown in FIG. 1, the DMM device 100 is able to display graphical voltage and current measurements at the same time on the same set of graphical axes, providing instant feedback to a user about the situation being measured.

Figure 2A:
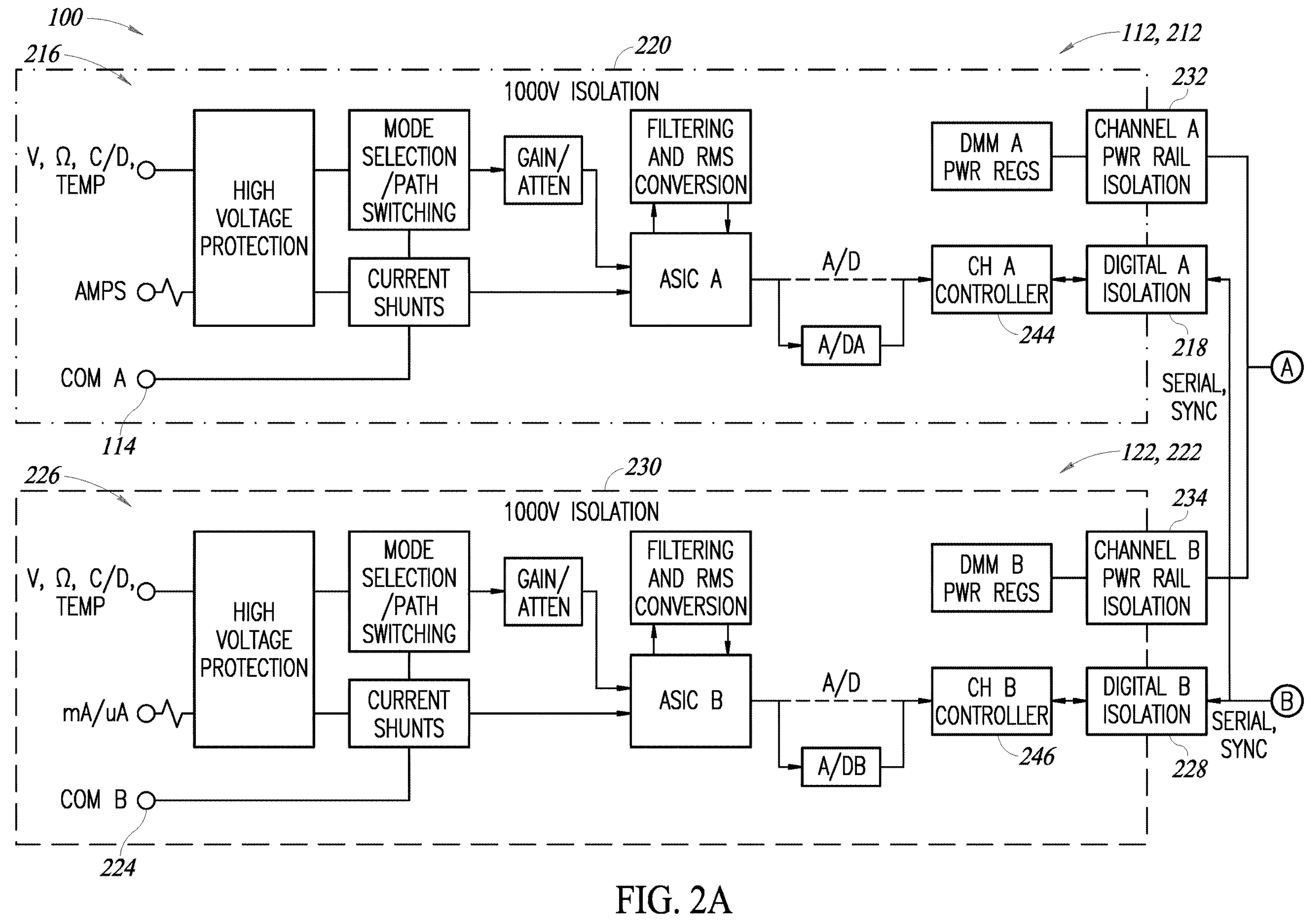
FIGS. 2A and 2B show circuit elements of a digital multimeter device according to at least one embodiment of the present disclosure.
Figure 2B:
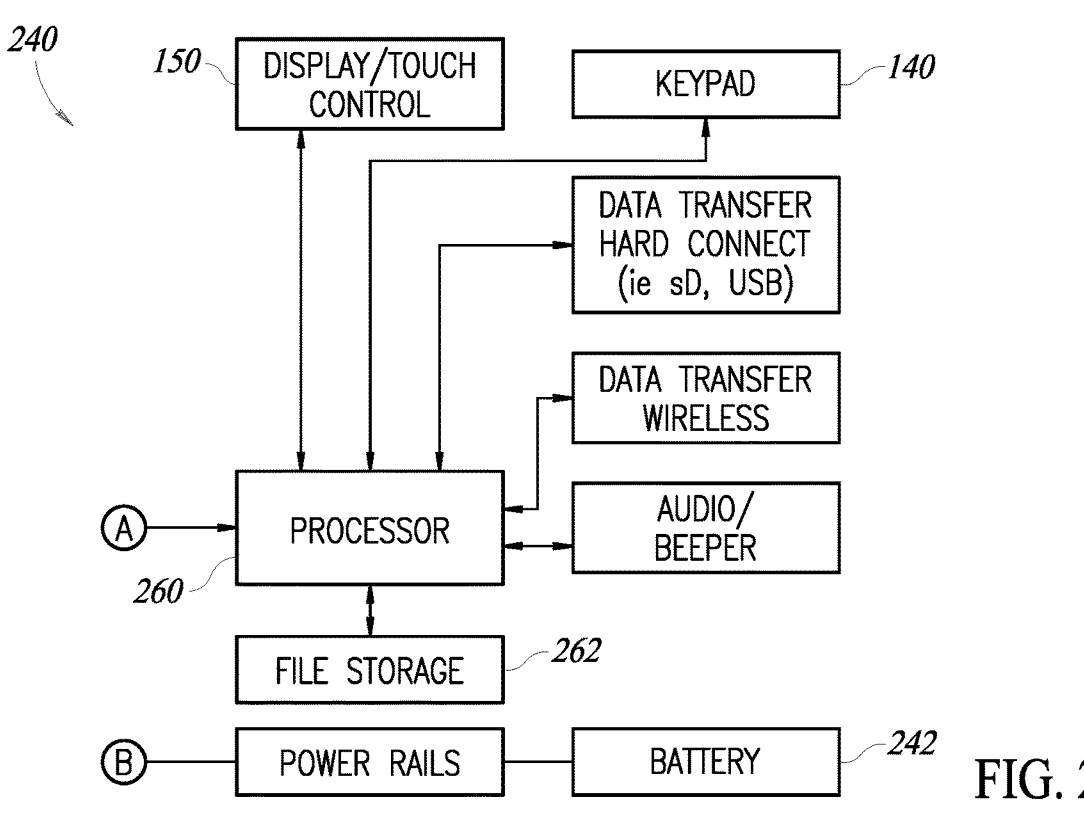

FIG. 2 (FIGS. 2A and 2B) shows an example block diagram of the circuitry elements of DMM device 100. FIG. 2A shows the isolated circuits of the first and second measurement channels 112, 122, and FIG. 2B shows the shared element. The circuitry elements include a first isolated circuit 212 for the first measurement channel 112, a second isolated circuit 222 for the second measurement channel 122, and shared elements 240 that are outside of and shared among the first measurement channel 112 and the second measurement channel 122.

The first and second isolated circuits 212, 222 are physically spaced apart and electrically isolated from one another. The first and second isolated circuits 212, 222 do not share any isolated element with one another. For each isolated circuit 212, 222, elements between the respective input stage 216, 226, e.g., the respective input terminal 118, 128 and the respective common terminal 114, 124, and the respective output stage 218, 228, are completed contained within the respective isolation shell 220, 230. The isolation shells 220, 230 include electrical insulation materials that form insulation barriers between the two isolated circuits 212, 222, which prevent high voltages from jumping across to areas of lower potential (arcing). In some implementations, the isolation shells 220, 230 also include thermal insulation materials. Further, the electrical insulation materials of the isolation shells 220, 230 also physically separate elements of the first isolated circuit 212 from those of the second isolated circuit 222. In some implementations, the isolation shells 220, 230 are each rated for electrical isolation for up to 1000 voltages, although the scope of the disclosure is not limited by any specific isolation ratings of the isolation shells 220, 230.

In some implementations, the output stages 218, 228 are isolated from one another with respect to their signal transmittance to/from the shared elements 240. For example, the output stages 218, 228 are isolated using capacitive connectivity using silicon-dioxide dielectric capacitors. For example, the output stages 218, 228 may include a digital isolator that includes a transmitter section and a receiver section coupled through capacitive coupling. Other digital isolators can also be used to isolate the digital data output stages 218, 228 from one another with respect to the data output to the shared elements 240.

In some implementations, each of the first and second isolated circuits 212, 222 receives power supply from the same power source 242, e.g., a battery, among the shared elements 240. The isolated circuits 212, 222 each include respective power rail isolation stages 232, 234 that enable the power rail signals to the first and second isolated circuits 212, 222 to be isolated from one another. In some implementations, the power rail isolation stages 232, 234 are transformers. However, other solutions to achieve power rail isolation are also possible and included in the scope of the disclosure.

In some implementations, one or more of the first isolated circuit 212 or the second isolated circuit 222 include an internal power source, e.g., a battery, within the respective isolation shell 220, 230. The power rail isolation stages 232, 234 may be eliminated for the isolated circuit that includes an internal power source.

In some implementations, the power source 242 includes primarily a removable Li-Ion battery pack. Because the isolated circuits 212, 222 are isolated from the earth, the power source 242 may also include a source that is referenced to earth ground. For example, the power source 242 may be provided by a PC or a mobile device using a USB-C cable coupled to the DMM device 100. In some implementations, the DMM device 100 is able to operate with full functionality, e.g., up to 1000 Vdc, while powered from a USB-C cable power source 242 that is referenced to earth ground. This power source would be able to charge the Li-Ion battery pack both while the DMM device 100 is powered off, and while one or more measurement channels 112, 122 is operating.

Within isolation shells 220, 230, the circuits 212, 222 can be any measurement circuit configurations, which does not limit the scope of the disclosure. U.S. Pat. Nos. 7,034,517, 7,679,356, 8,358,121, 6,466,003, and/or 6043640 disclose various implementations of measurement circuits, which can be referred to appreciate the details of the measurement circuits 212, 222, and the disclosure of which are incorporated herein by reference.

In some implementations, as illustrated in FIG. 2, the first isolated circuit 212 and the second isolated circuit 222 include the same or similar circuit elements. The same or similar circuit elements may include different parameters in one or more of the circuit elements. For example, as shown in FIG. 1, the first isolated circuit 212 and the second isolated circuit 222 include different fuse parameters.

In some implementations, the first isolated circuit 212 and the second isolated circuit 222 include different circuit elements and/or circuit configurations. For example, the first measurement channel 112 and the second measurement channel 122 may include different measurement modes, and correspondingly, the signal paths of the isolated circuits 212, 222 are designed differently.

In some implementations, the first isolated circuit 212 and the second isolated circuit 222 each include a respective microcontroller 244, 246 within the respective isolation shell 220, 230. The microcontrollers 244, 246 within the isolated shell can improve the speeds in automatically checking the measurement data in various measurement scenarios, e.g., automatic range adjustment. In a case where microcontrollers 244, 246 are in the isolation shells 220, 230, analog to digital A/D converters are also included in each of the isolated circuits 212, 222, configured to convert the analog measurement data into digital data suitable for the processing by the microcontrollers 244, 246, respectively, before the measurement data is sent to the shared elements 240 through the respective isolated output stages 218, 228.

The shared elements 240 include a processor 260 coupled to receive data from the isolated output stages 218, 228 of the isolated circuits 212, 222, and a file storage unit 262 (e.g., a memory device), the display section 150, and the keypad section 140 all communicatively and/or electronically coupled to the processor 260. The shared elements 240 also include other typical elements of a DMM. For example, the shared elements 240 may include hardware connection elements for data transfer, like SD port, microSD port, USB port, HDMI port, etc. The shared elements 240 may also include wireless data communication units. Audio or beeper units are also included in the shared elements 240, which are configured to provide an audio reminder or alarm to a user based on instructions of the processor 260.

The file storage unit 262 includes one or more data processing applications stored thereon. The data processing applications each, when executed by processor 260, enable processor 260 to process the measurement data of one or more of the first measurement channel 112 or the second measurement channel 122. For example, processor 260 may process the measurement data of the first measurement channel 112 or the second measurement channel 122 together locally to generate analysis results that are not available through existing DMM solutions.

Figure 3:
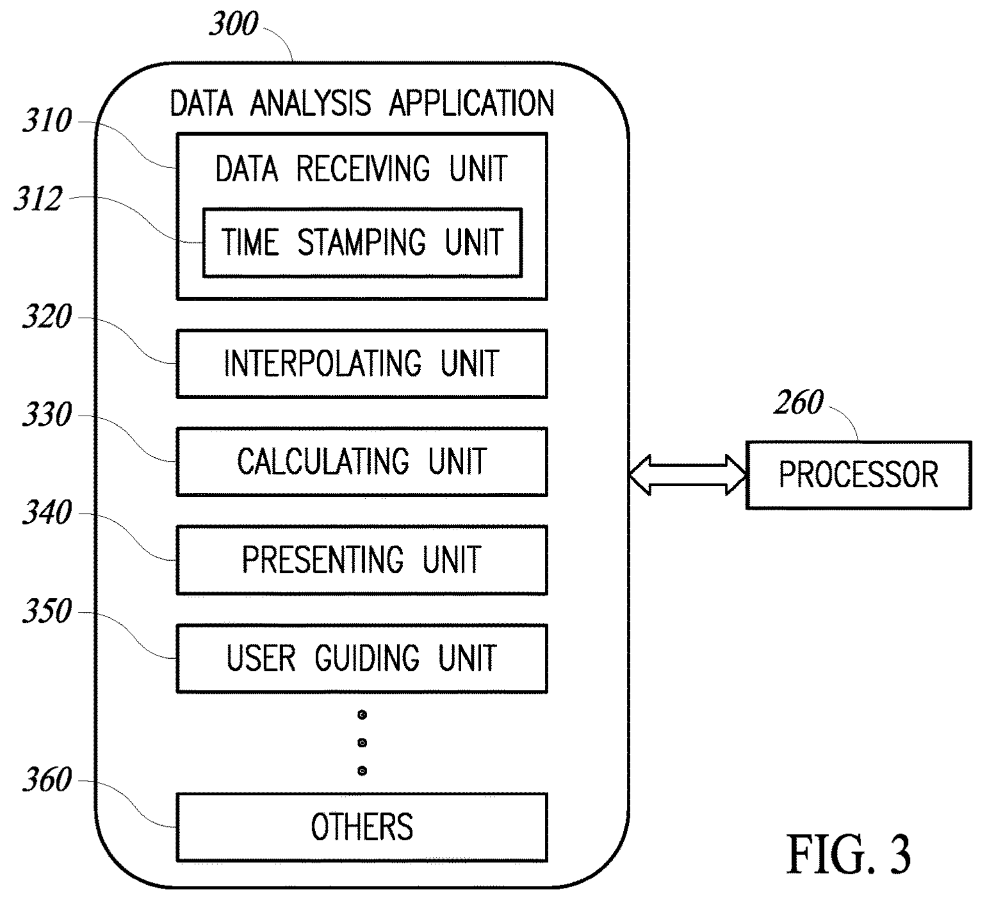
FIG. 3 shows a data analysis application contained in a digital multimeter device according to at least one embodiment of the present disclosure.

FIG. 3 illustratively shows a data analysis application 300. The data analysis application 300 includes, among others, a data receiving unit 310 including a time-stamping unit 312, an interpolating unit 320, a calculating unit 330, a presenting unit 340, and a user guiding unit 350. Other units 360 include data processing modules that a DMM device typically includes, which support the functioning of each of the measurement channels 112, 122. Further, the processor 260, under the control of the data analysis application 300, may communicate with the microcontrollers 244, 246 in the respective measurement functions of the first and second measurement channels 112, 122.

The data receiving unit 310 is configured to receive measurement data from the first and second measurement channels 112, 122 for further analysis and presentation. In some implementations, the data receiving unit 310 also filters the measurement data to obtain the ones that are suitable for the selected data analysis and presentation function that are selected by a user through the keypads in keypad section 140.

The time stamping unit 312 is configured to assign a time stamp on a piece of measurement data received from the first measurement channel 112 or the second measurement channel 122. The timestamp can be configured to be the time point at which the piece of data is received by the data receiving unit 310 or can be configured to be the time point when the analog measurement data is converted into digital data and received by the respective microcontroller 244, 246. The time stamping unit 312 may constantly calibrate and synchronize the time clock with the microcontrollers 244, 246 to maintain the consistency in the time stamps.

The interpolating unit 320 is configured to conduct interpolation on the measurement data received from one or more of the first measurement channel 112 or the second measurement channel 122. For example, the data receiving unit 310 receives a sequence of first measurement values from the first measurement channel 112 and a second sequence of measurement values from the second measurement channel 122. The first sequence and second sequence of measurement values may not fully correspond to one another in the time stamps. For example, the measurement data of the first measurement channel 112 may not perfectly align with, from a time stamp perspective, the measurement data of the second measurement channel 122. There may be missing data points for a specific time point, and there may be offsets in time between the two measurement data. The interpolating unit 320 processes one or more of the measurement data of the first or second measurement channels using data interpolation techniques such that data sets are generated, which have data of the first measurement channel aligned with data of the second measurement channel.

The calculating unit 330 is configured to analyze the measurement data of one or more of the first measurement channel 112 or the second measurement channel 122 to generate an analysis result. For example, the first measurement channel 112 obtains voltage data, a first electrical parameter, of an object, the second measurement channel 122 obtains current data, a second electrical parameter, of the object, and the calculating unit 330 calculates resistance data, a third electrical parameter, of the object based on the voltage data and the current data and based on the time stamps of the voltage data and the current data. For example, the time stamps are used to match the voltage data and corresponding current data in the calculating of the resistance value of an object in a data fusing operation of the calculating unit 330. For another example, the first measurement channel 112 obtains resistance data of an object, the second measurement channel 122 obtains temperature data of the object, and the calculating unit 330 analyzes a correlation between the resistance of the object and the temperature of the object. For a further example, the first measurement channel 112 obtains current data of a first portion or a first isolated section of an object circuit, the second measurement channel 122 obtains temperature data of a second different portion or a second isolated section of the object circuit, and the calculating unit 330 analyzes a correlation between the current flowing through the first portion of the object circuit with the temperature on the second portion of the object circuit.

Taking advantage of having measurement data of the two isolated measurement channels 112, 122, the calculating unit 330 is capable of performing various analytic processing of the data locally without the assistance of a third device through internet connections. As such, the DMM device 100, having two or more independent measurement channels, performs even more functions than two or more separate DMM devices can.

The data analysis tasks of the calculating unit 330 can be selected by a user through the keypads of the keypad section 140, and can also be done automatically through the configurations of the computer executable instructions contained in the data analysis application 300. For example, the calculating unit 330 may automatically perform a measurement shutdown act based on analyzing the measurement data of one or more of the measurement channels 112 and 122. For example, when the calculating unit 330 determines, based on the measurement data of the second measurement channel 122 that a short circuit occurs in an object circuit, the calculating unit 330 may shut down the first measurement channel 112 with respect to measuring a current of the same object circuit.

The presenting unit 340 is configured to present, through the same display section 150, the measurement results of one or more of the first or the second measurement channels 112, 122, various combinations of the measurement results of the first or the second measurement channels 112, 122, or the data processing results of the calculating unit 330. The measurement data of the two measurement channels 112, 122 may be presented together in various manners. For example, measurement data of the two measurement channels may be presented in a graphing manner in comparison with one another. A sequence of measurement results of the two measurement channels may be plotted in the same chart. Further, the calculation results of the calculating unit 330 may be presented together with the measurement results of the first and second measurement channels on the same display section 150. The various ways of presenting the measurement and calculating results can be selected by the touchscreen buttons 160, 162, illustratively shown as "Menu A" and "Menu B", and/or by the menu buttons 142.

The user guiding unit 350 is configured to present user guidance on making measurements using one or more of the first or second measurement channels 112, 122. In some implementations, the user guiding unit 350 provides guidance on making measurements using one of the measurement channels based on the measurement results of the other measurement channels. For example, when the calculating unit 330 determines, based on the measurement data of the measurement channel 122, that a short circuit occurs in an object circuit, the user guiding unit 350 may guide a user not to use the measurement channel 112 to measure current of the same object circuit.

Figure 4:
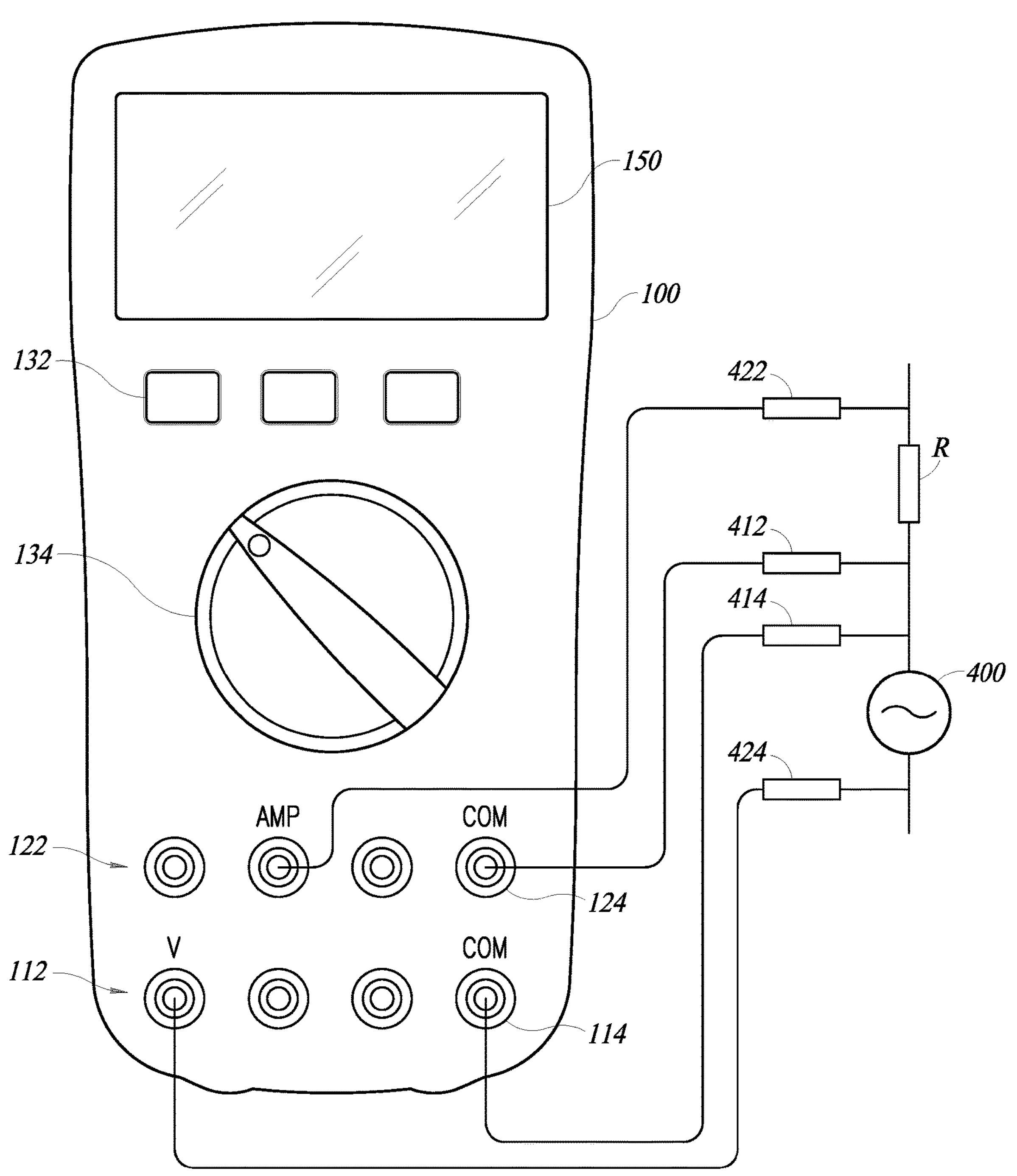
FIG. 4 shows a use scenario of a digital multimeter device according to at least one embodiment of the present disclosure.
Figure 5:
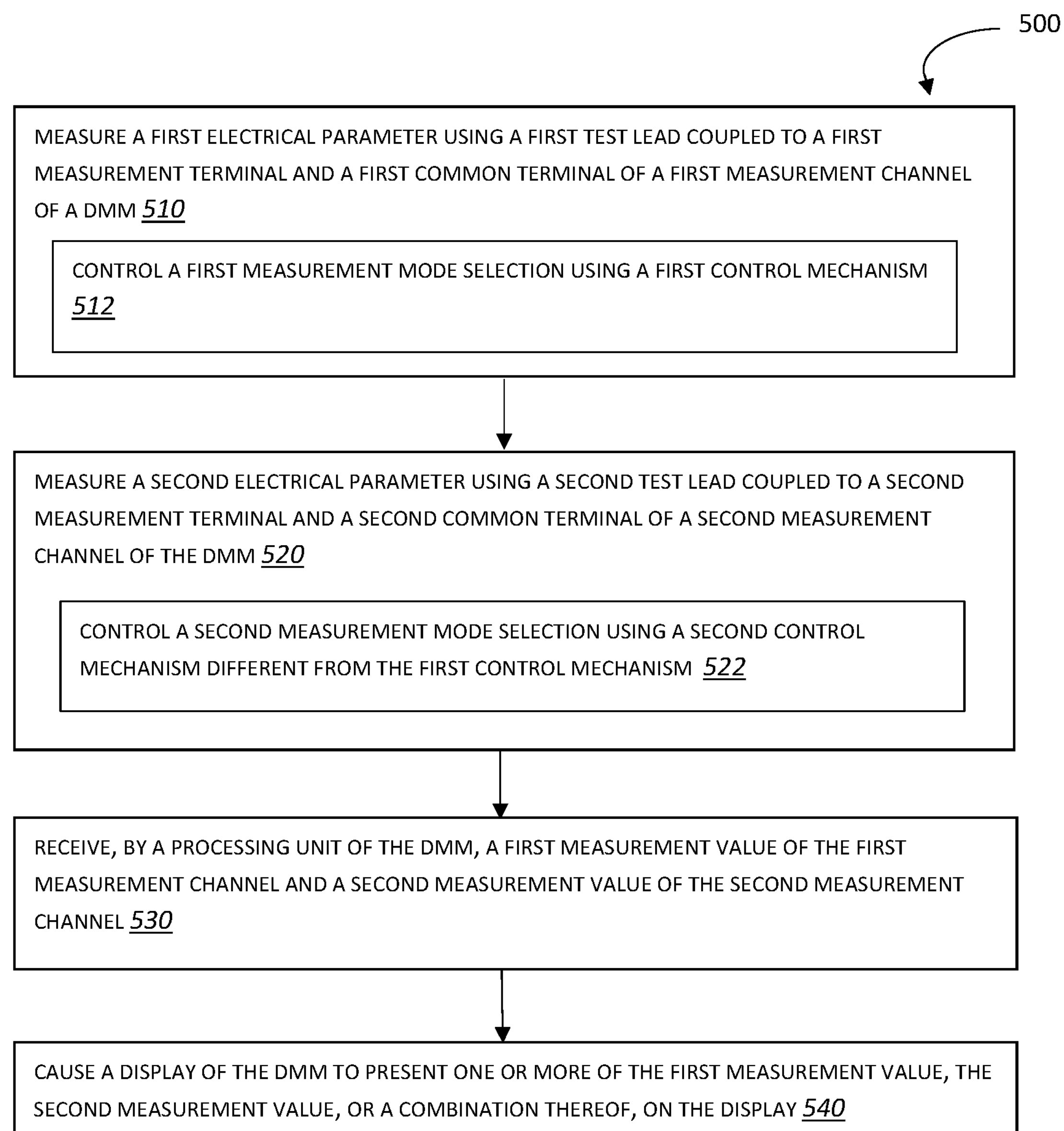
FIG. 5 shows a flow diagram of a method of conducting measurements of electrical parameters using a digital multimeter device according to at least one embodiment of the present disclosure.

FIG. 4 illustrates an example use scenario of the DMM device 100. The two measurement channels 112, 122 can be used to conduct measurement operations, e.g., concurrently, on an object 400 with independent control of each of the measurement operations. Because the two measurement channels 112, 122 have their respective common terminals 114, 124, the two concurrent measurements will not interfere with one another. FIG. 5 shows an example flow diagram of method 500 of conducting measurements using the DMM device 100. Referring to FIGS. 4 and 5 together, in operation 510, the first measurement channel 112 is used to measure a first electrical parameter. For example, a first set of test leads are coupled to the first measurement terminal 113 (FIG. 1) and the first common terminal 114 of the first measurement channel 112. In operation 510, the first measurement mode selection is controlled by a first control mechanism, e.g., the set of control relays of the first mode selection unit 132 (FIG. 1). As illustratively shown in FIG. 4, for example, the first measurement channel 112 is used to measure a voltage parameter of the object 400, with probes 412, 414 respectively coupled to a voltage input terminal and the first common terminal 114 of the first measurement channel 112.

In operation 520, the second measurement channel 122 is used to measure a second electrical parameter. For example, a second set of test leads are coupled to the second measurement terminal 123 (FIG. 1) and the second common terminal 124 of the second measurement channel 122. In operation 520, the second measurement mode selection is controlled by a second control mechanism, e.g., the control rotary of the second mode selection unit 134 (FIG. 1). As illustratively shown in FIG. 4, for example, the second measurement channel 122 is used to measure a current parameter of an object R, e.g., in a path coupled to the object 400, with probes 422, 424 respectively coupled to an AMP input terminal and the second common terminal 124 of the second measurement channel 122.

In operation 530, a first measurement value of the first measurement channel 112, e.g., a voltage parameter of the object 400, and a second measurement value of the second measurement channel 122, e.g., a current parameter of the object 400, are received by the processor 260 (FIG. 1) of the DMM device 100.

In operation 540, processor 260 causes display 150 of the DMM device 100 to present one or more of the first measurement value, the second measurement value, or a combination thereof, on display 150.

Using the DMM device 100 in a measurement application, as shown in FIG. 4, a user can concurrently monitor the voltage of, e.g., a battery, and a current being delivered to a load using a single meter, which is very convenient and user-friendly. Further, as illustrated in FIG. 1, the measurement results of the current and the voltage parameters of object 400 can be presented together using graphs on a single set of axes, all based on local processing by the DMM device 100. On the contrary, to do the same tasks traditionally with separate meters would require monitoring numbers or graphical information on two separate meters, and would require separate manual calculations to provide any kind of power information, especially if there is no wireless connectivity to communicatively couple the two separate meters together or to a remote server. Traditionally, graphing both measurements on a single set of axes would require the measurement data to be collected by a third device (mobile or computer) running a software application that could extract measurement data from both units and consolidate the information into a proper format. DMM 100 resolves all those technical problems.

In other use scenarios, the two measurement channels 112, 122 can be used to concurrently measure the same electrical parameter of the same object, the same electrical parameter of two different objects or two different portions of the same object, two different electrical parameters of two different objects or two different portions of a same object.

For example, in an instance where the circuits being measured are independently referenced in which references should not be electrically connected, the DMM device 100 could be used to make comparative measurements. For example, in a printed circuit assembly situation, the DMM device 100 can be used to concurrently measure electrical parameters in multiple isolated analog sections of a single board, or be used to perform concurrent measurements on a digital area and on an analog area of the same circuit board, and the measurements of the two channels can be compared and presented through the same display section 150 of the DMM device 100.

For example, in an instance of troubleshooting circuits, the DMM device 100 can be used to compare measurements on similar locations between a bad circuit board and a 'known good' circuit board. Using the DMM device 100 as described herein, a user could make concurrent measurements of the same characteristic or electrical parameter, e.g., voltage or current, on two objects, and easily see similarities or differences between the two objects, e.g., circuits, on a single display, either numerically or graphically. The data calculation and analysis can be conducted locally by the processor 260 based on the data analysis function(s) selected by the user, e.g., through the keypads of the keypad section 140 or automatically by the data analysis application 300. The local data analysis and presentation efficiently show the differences between the two measurement inputs to the two measurement channels 112 and 122 such that the user can quickly identify significant measurement differences when the same occurs.

Having two independent isolated measurement channels in the same DMM device 100 provides various technical advantages. It is very convenient for a user to carry one measurement device that can perform two measurements concurrently. Further, receiving the two sets of measurement data by the same processing unit enables local processing of the two sets of data within the reliance on connectivity, which could be unreliable or unavailable in some use scenarios. The results of the local data processing can be presented to the user in substantially real-time and can guide the user in making further measurements. Moreover, collecting two separate sets of measurement data by the same device enables efficient and accurate matching of the measurement data of the two sets, which improves the quality of data processing using the two sets of measurement data together.

It should be appreciated that the various embodiments described above can be combined to provide yet further embodiments of the DMM device 100. Aspects of the embodiments can be modified, and other changes can be made to the embodiments in light of the above-detailed description without departing from the spirit or scope of the disclosure.

Described embodiments of the subject matter can include one or more examples herein, alone or in combination.

An example handheld measurement device includes a first measurement channel configured to measure an electrical parameter of an object and determine a first measurement value, and the first measurement channel optionally includes a first common terminal. The example optionally includes a second measurement channel configured to measure an electrical parameter of an object and determine a second measurement value, and the second measurement channel optionally includes a second common terminal that is separate from the first common terminal, and the second measurement channel is optionally electrically isolated from the first measurement channel. The example optionally includes a processing unit electrically coupled to both the first measurement channel and the second measurement channel and configured to receive the first measurement value and the second measurement value. The example optionally includes a display electrically coupled to the processing unit and configured to present one or more of the first measurement value or the second measurement value, or a combination thereof, on the display. The display is optionally configured to display a graphic presentation of one or more of the first measurement value or the second measurement value, or a combination thereof.

The processing unit is optionally configured to assign a time stamp to each of the first measurement value and the second measurement value, respectively; optionally configured to obtain a third electrical parameter of the same object based on the first measurement value and the second measurement value; optionally configured to obtain the third electrical parameter of the same object based on the first measurement value, the second measurement value, and time stamps of the first measurement value and the second measurement value.

The first measurement channel and the second measurement channel are optionally configured to measure the electrical parameters of the objects concurrently, optionally configured to measure electrical parameters of a same object, optionally configured to measure a first electrical parameter and a second different electrical parameter of the same object, or optionally configured to measure a same electrical parameter with different measurement granular levels. The second measurement channel is optionally spaced apart from the first measurement channel.

The first measurement value optionally includes a first sequence of measurement values and the second measurement value includes a second sequence of measurement values, and the processing unit is optionally configured to conduct data interpolation on one or more of the first sequence of measurement values and the second sequence of measurement values.

The example optionally includes a control rotary and a set of control relays, and the control rotary is optionally coupled to the first measurement channel, and the set of control relays are optionally coupled to the second measurement channel. The example optionally includes an insulation barrier between circuit components of the second measurement channel and circuit components of the first measurement channel. The example optionally includes a master switch configured to control measurement selection and signal path of the first measurement channel and the second measurement channel.

An example handheld measurement system includes a body. The body optionally includes: a first measurement channel configured to measure an electrical parameter of an object and determine a first measurement value, and the first measurement channel optionally includes a first common terminal. The body optionally includes a second measurement channel configured to measure an electrical parameter of an object and determine a second measurement value, and the second measurement channel optionally includes a second common terminal that is separate from the first common terminal, and the second measurement channel is optionally electrically isolated from the first measurement channel. The example optionally includes a user interface, and the user interface optionally includes a display configured to present one or more of the first measurement value and the second measurement value, or a combination thereof. The example optionally includes a first set of measurement terminals coupled to the first measurement channel and a second set of measurement terminals coupled to the second measurement channel. Optionally, the second set of measurement terminals are each separate from the first set of measurement terminals. The example optionally includes a first control unit coupled to the first measurement channel and a second control unit coupled to the second measurement channel. The example optionally includes a processing unit electrically coupled to both the first measurement channel and the second measurement channel and configured to receive the first measurement value and the second measurement value. The first control unit is optionally a control rotary and the second control unit is optionally a set of control relays.

An example method includes measuring a first electrical parameter using a first test lead coupled to a first measurement terminal and a first common terminal of a first measurement channel of a handheld measurement device. The example method optionally includes measuring a second electrical parameter using a second test lead coupled to a second measurement terminal and a second common terminal of a second measurement channel of the handheld measurement device. The second measurement terminal and the second common terminal are optionally different from the first measurement terminal and the first common terminal, respectively. A processing unit is optionally configured to be electrically coupled to the first measurement channel and the second measurement channel. The processing unit is optionally configured to receive a first measurement value of the first measurement channel and a second measurement value of the second measurement channel. The example method optionally includes causing a display electrically coupled to the processing unit to present one or more of the first measurement value, the second measurement value, or a combination thereof, on the display.

The example method specifies that the first electrical parameter is optionally a current flowing through an object, the second electrical parameter is, optionally, a voltage of the object, and that the processing unit, optionally, calculates a resistance of the object based on the first measurement value and the second measurement value. The example method specifies that the measuring the first electrical parameter using the first test lead optionally includes measuring a first portion in a circuit, and the measuring the second electrical parameter using the second test lead optionally includes measuring a second different portion in the circuit, and the example method optionally further includes comparing the first measurement value and the second measurement value as shown in the same display. The example method specifies that the measuring the first electrical parameter using the first test lead optionally includes measuring a first electrical characteristic of a first object, and the measuring the second electrical parameter using the second test lead optionally includes measuring the first electrical characteristic of a second different object, and the example method optionally further includes comparing the first measurement value and the second measurement value as shown in the same display. The example method specifies that the measuring the first electrical parameter optionally includes controlling a first measurement mode selection using a first control mechanism; and the measuring the second electrical parameter optionally includes controlling a second measurement mode selection using a second control mechanism different from the first control mechanism. The example specifies that the first control unit is optionally a control rotary and the second control unit is optionally a set of control relays, and the control rotary and the set of control relays are optionally on the handheld measurement device. The example specifies that the measuring the second electrical parameter is optionally conducted concurrently with the measuring a first electrical parameter.

For the purposes of the present disclosure, unless otherwise indicated, the phrase "A and B" is nonlimiting and means one or more of (A) and one or more of (B); the phrase "A or B" is nonexclusive and means one or more of (A), one or more of (B), or one or more of (A and B); "A and/or B" means one or more of (A), one or more of (B), or one or more of (A and B); the phrase "at least one of A and B" means at least one of (A) and at least one of (B); the phrase "one or more of A and B" means one or more of (A) and one or more of (B); the phrase "at least one of A or B" means at least one of (A), at least one of (B), or at least one of (A and B); and the phrase "one or more of A or B" means one or more of (A), one or more of (B), or one or more of (A and B). By way of extension, for example, the phrase "at least one of A, B, or C" means at least one of (A), at least one of (B), at least one of (C), at least one of (A and B), at least one of (A and C), at least one of (B and C), or at least one of (A, B and C). In the above, A, B, and C represent any form or type of element, feature, arrangement, component, structure, aspect, action, step, or the like.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A handheld measurement device, comprising:

a first measurement channel configured to measure an electrical parameter of an object and determine a first measurement value, the first measurement channel including a first common terminal and a first ASIC circuit and a first A/D converter coupled to the first common terminal;

a second measurement channel configured to measure an electrical parameter of an object and determine a second measurement value, the second measurement channel including a second common terminal that is separate from the first common terminal, the second measurement channel including a second ASIC circuit and a second A/D converter coupled to the second common terminal, and the second measurement channel including the second ASIC circuit and the second A/D converter being electrically isolated from the first measurement channel including the first ASIC circuit and the first A/D converter by one or more isolation shells each having an electrical insulation material;

a processing unit electrically coupled to both the first measurement channel and the second measurement channel and configured to receive the first measurement value and the second measurement value; and a display electrically coupled to the processing unit and configured to present one or more of the first measurement value or the second measurement value, or a combination thereof.

2. The handheld measurement device of claim 1, wherein the processing unit is configured to assign a time stamp to each of the first measurement value and the second measurement value, respectively.

3. The handheld measurement device of claim 1, wherein the first measurement channel and the second measurement channel are configured to measure the electrical parameters of the objects concurrently.

4. The handheld measurement device of claim 1, wherein the first measurement channel and the second measurement channel are configured to measure electrical parameters of a same object.

5. The handheld measurement device of claim 4, wherein the first measurement channel and the second measurement channel are configured to measure a first electrical parameter and a second different electrical parameter of the same object.

6. The handheld measurement device of claim 5, wherein the processing unit is configured to obtain a third electrical parameter of the same object based on the first measurement value and the second measurement value.

7. The handheld measurement device of claim 6, wherein the processing unit is configured to obtain the third electrical parameter of the same object based on the first measurement value, the second measurement value, and time stamps of the first measurement value and the second measurement value.

8. The handheld measurement device of claim 6, wherein the first measurement value includes a first sequence of measurement values and the second measurement value includes a second sequence of measurement values, and wherein the processing unit is configured to conduct data interpolation on one or more of the first sequence of measurement values and the second sequence of measurement values.

9. The handheld measurement device of claim 1, comprising a control rotary and a set of control relays, wherein the control rotary is coupled to the first measurement channel and the set of control relays are coupled to the second measurement channel.

10. The handheld measurement device of claim 1, wherein the first measurement channel and the second measurement channel are configured to measure a same electrical parameter with different measurement granular levels.

11. The handheld measurement device of claim 1, wherein the display is configured to display a graphic presentation of one or more of the first measurement value or the second measurement value, or a combination thereof.

12. The handheld measurement device of claim 1, wherein the one or more isolation shells form an insulation barrier between circuit components of the second measurement channel and circuit components of the first measurement channel.

13. The handheld measurement device of claim 1, wherein the second measurement channel is spaced apart from the first measurement channel.

14. The handheld measurement device of claim 1, comprising a master switch configured to control measurement selection and signal path of the first measurement channel and the second measurement channel.

15. A handheld measurement system, comprising:

a body, the body including:

a first measurement channel configured to measure an electrical parameter of an object and determine a first measurement value, the first measurement channel including a first common terminal, the first measurement channel including a first ASIC circuit and a first A/D converter enclosed within a first isolation shell having an electrical insulation material;

a second measurement channel configured to measure an electrical parameter of an object and determine a second measurement value, the second measurement channel including a second common terminal that is separate from the first common terminal, the second measurement channel including a second ASIC circuit and a second A/D converter enclosed within a second isolation shell having an electrical insulation material, and the second measurement channel being electrically isolated from the first measurement channel by one or more of the first isolation shell or the second isolation shell; and a user interface, the user interface including:

a display configured to present one or more of the first measurement value and the second measurement value, or a combination thereof;

a first set of measurement terminals coupled to the first measurement channel;

a second set of measurement terminals coupled to the second measurement channel, the second set of measurement terminals each separate from the first set of measurement terminals;

a first control unit coupled to the first measurement channel; and a second control unit coupled to the second measurement channel.

16. The system of claim 15, further comprising a processing unit electrically coupled to both the first measurement channel and the second measurement channel and configured to receive the first measurement value and the second measurement value.

17. The system of claim 15, wherein the first control unit is a control rotary and the second control unit is a set of control relays.

18. A method, comprising:

measuring a first electrical parameter using a first test lead coupled to a first measurement terminal and a first common terminal of a first measurement channel of a handheld measurement device, the first measurement channel including a first ASIC circuit and a first A/D converter;

measuring a second electrical parameter using a second test lead coupled to a second measurement terminal and a second common terminal of a second measurement channel of the handheld measurement device, the second measurement terminal and the second common terminal different from the first measurement terminal and the first common terminal, respectively, the second measurement channel including a second ASIC circuitry and a second A/D converter, the second measurement channel including the second ASIC circuitry and the second A/D converter being electrically isolated from the first measurement channel including the first ASIC circuitry and the first A/D converter by the one or more isolation shells, wherein a processing unit electrically coupled to both the first measurement channel and the second measurement channel receives a first measurement value of the first measurement channel and a second measurement value of the second measurement channel; and causing a display electrically coupled to the processing unit to present one or more of the first measurement value, the second measurement value, or a combination thereof, on the display.

19. The method of claim 18, wherein the first electrical parameter is a current flowing through an object, the second electrical parameter is a voltage of the object, and wherein the processing unit calculates a resistance of the object based on the first measurement value and the second measurement value.

20. The method of claim 18, wherein the measuring the first electrical parameter using the first test lead includes measuring a first portion in a circuit, and the measuring the second electrical parameter using the second test lead includes measuring a second different portion in the circuit, and the method further comprises comparing the first measurement value and the second measurement value as shown in the same display.

21. The method of claim 18, wherein the measuring the first electrical parameter using the first test lead includes measuring a first electrical characteristic of a first object, and the measuring the second electrical parameter using the second test lead includes measuring the first electrical characteristic of a second different object, and the method further comprises comparing the first measurement value and the second measurement value as shown in the same display.

22. The method of claim 18, wherein the measuring the first electrical parameter includes controlling a first measurement mode selection using a first control mechanism; and wherein the measuring the second electrical parameter includes controlling a second measurement mode selection using a second control mechanism different from the first control mechanism.

23. The method of claim 22, wherein the first control mechanism is a control rotary and the second control mechanism is a set of control relays, the control rotary and the set of control relays on the handheld measurement device.

24. The method of claim 18, wherein the measuring the second electrical parameter is conducted concurrently with the measuring a first electrical parameter.

* * * * *